United States Patent
Park et al.

(10) Patent No.: US 9,257,677 B2
(45) Date of Patent: Feb. 9, 2016

(54) ORGANIC LIGHT EMITTING DIODE DISPLAY HAVING LOW REFRACTION PROTRUSIONS

(71) Applicant: Samsung Display Co., Ltd., Yongin, Gyeonggi-Do (KR)

(72) Inventors: Soon-Ryong Park, Yongin (KR); Tae-Eun Kim, Yongin (KR); Hye-Jung Park, Yongin (KR); Woo-Suk Jung, Yongin (KR); Chul-Woo Jeong, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/340,456

(22) Filed: Jul. 24, 2014

(65) Prior Publication Data
US 2015/0041779 A1 Feb. 12, 2015

(30) Foreign Application Priority Data
Aug. 8, 2013 (KR) .................. 10-2013-0094273

(51) Int. Cl.
*H01L 51/52* (2006.01)

(52) U.S. Cl.
CPC ........ *H01L 51/5275* (2013.01); *H01L 51/5253* (2013.01); *H01L 2251/5338* (2013.01); *H01L 2251/5369* (2013.01)

(58) Field of Classification Search
CPC .................................. H01L 51/5275
See application file for complete search history.

(56) References Cited

U.S. PATENT DOCUMENTS

| | | | | |
|---|---|---|---|---|
| 7,446,473 B2* | 11/2008 | Tanaka | .......................... | 313/506 |
| 7,750,350 B2* | 7/2010 | Fischer et al. | .................. | 257/72 |
| 7,800,100 B2* | 9/2010 | Lee et al. | ......................... | 257/40 |
| 8,120,248 B2* | 2/2012 | Shinto et al. | .................. | 313/506 |
| 8,469,551 B2* | 6/2013 | Wolk et al. | ................. | 362/311.02 |
| 8,542,200 B2* | 9/2013 | Lee et al. | ....................... | 345/173 |
| 8,547,015 B2* | 10/2013 | Wolk et al. | ..................... | 313/512 |
| 8,610,155 B2* | 12/2013 | Hatano et al. | ................... | 257/99 |
| 8,618,730 B2* | 12/2013 | Park et al. | ...................... | 313/504 |
| 8,760,046 B2* | 6/2014 | Seo et al. | ....................... | 313/498 |
| 8,822,997 B2* | 9/2014 | Yamazaki | ......................... | 257/59 |
| 8,841,675 B2* | 9/2014 | Saito et al. | ....................... | 257/67 |
| 8,896,921 B2* | 11/2014 | Lee | .......................... | 359/486.01 |
| 8,957,578 B2* | 2/2015 | Lee | .................................. | 313/504 |
| 8,987,718 B2* | 3/2015 | Koo et al. | ......................... | 257/40 |
| 9,001,027 B2* | 4/2015 | Choi et al. | ..................... | 345/107 |
| 2005/0146654 A1* | 7/2005 | Tseng | .............................. | 349/69 |
| 2008/0176477 A1* | 7/2008 | Hwang et al. | ................... | 445/24 |
| 2010/0230664 A1* | 9/2010 | Yamazaki et al. | ............... | 257/40 |
| 2011/0227080 A1* | 9/2011 | Roh et al. | ......................... | 257/59 |
| 2013/0005059 A1* | 1/2013 | Song et al. | ....................... | 438/28 |
| 2014/0097408 A1* | 4/2014 | Kim et al. | ........................ | 257/40 |

FOREIGN PATENT DOCUMENTS

| | | |
|---|---|---|
| JP | 2012-255819 A | 12/2012 |
| KR | 10-2009-0020790 A | 2/2009 |
| KR | 10-2010-0090497 A | 8/2010 |
| KR | 10-2011-0079911 A | 7/2011 |

* cited by examiner

*Primary Examiner* — Ida M Soward
(74) *Attorney, Agent, or Firm* — Innovation Counsel LLP (57) ABSTRACT

An organic light emitting diode display is provided. The organic light emitting diode display includes a flexible substrate, an organic light emitting diode disposed on the flexible substrate, a thin film encapsulator disposed on the organic light emitting diode, a plurality of low refraction protrusions disposed on at least one of a surface of the flexible substrate and the thin film encapsulator, wherein each of the low refraction protrusions is formed having an isosceles trapezoid shape, and a high refraction layer disposed covering the plurality of low refraction protrusions.

9 Claims, 8 Drawing Sheets

ORGANIC LIGHT EMITTING DIODE DISPLAY HAVING LOW REFRACTION PROTRUSIONS

CROSS-REFERENCE TO RELATED APPLICATION

This application claims priority to and the benefit of Korean Patent Application No. 10-2013-0094273 filed in the Korean Intellectual Property Office on Aug. 8, 2013, the entire contents of which are incorporated herein by reference.

BACKGROUND

1. Technical Field

The present disclosure relates to an organic light emitting diode (OLED) display and an optical film. More particularly, the present disclosure relates to an organic light emitting diode (OLED) display including a flexible substrate and an optical film.

2. Description of the Related Art

Organic light emitting diode displays have been identified as next generation display devices. For example, the organic light emitting diode display possesses superior characteristics such as low power consumption, high luminance, and rapid response times. Unlike a liquid crystal display (LCD) device, the organic light emitting diode display has self-luminance characteristics and does not require a separate light source. Accordingly, the thickness and weight of the organic light emitting diode display can be reduced relative to that of the liquid crystal display (LCD) device.

Generally, an organic light emitting diode (OLED) display includes a substrate and an organic light emitting diode provided on the substrate. The organic light emitting diode may include a first electrode, an organic emission layer, and a second electrode that are sequentially stacked.

When a conventional flexible organic light emitting diode (OLED) display is bent, the light emitted by the organic light emitting diode is irradiated in the bent direction, which reduces the amount of light irradiated to the front of the display. Typically a viewer's vision is directed to the front of the display. As a result, the viewer may observe a dimmer image at the front of the display when the display is bent.

SUMMARY

The present disclosure is directed to address at least the above deficiencies in conventional flexible organic light emitting diode (OLED) displays.

According to some embodiments of the inventive concept, an organic light emitting diode display is provided. The organic light emitting diode display includes a flexible substrate, an organic light emitting diode disposed on the flexible substrate, a thin film encapsulator disposed on the organic light emitting diode, a plurality of low refraction protrusions disposed on at least one of a surface of the flexible substrate and the thin film encapsulator, wherein each of the low refraction protrusions is formed having an isosceles trapezoid shape, and a high refraction layer disposed covering the plurality of low refraction protrusions.

In some embodiments, a refractive index of the low refraction protrusions may be less than a refractive index of the high refraction layer.

In some embodiments, the refractive index of the low refraction protrusions may be about 1.4, and the refractive index of the high refraction layer may be about 1.6.

In some embodiments, the organic light emitting diode display may further include a plurality of nanobeads disposed in the low refraction protrusions.

In some embodiments, the refractive index of the nanobeads is between the refractive index of the low refraction protrusions and the refractive index of the high refraction layer.

In some embodiments, the refractive index of the nanobeads ranges from about 1.4 to about 1.6.

In some embodiments, the organic light emitting diode may be configured to emit green light having a first wavelength, and the high refraction layer may be configured to absorb green light having a second wavelength.

In some embodiments, the second wavelength may range from about 460 nm to about 480 nm.

In some embodiments, the organic light emitting diode display may further include a retarder plate disposed on the high refraction layer, and a polarizing plate disposed on the retarder plate.

According to some other embodiments of the inventive concept, an optical film for displaying an image is provided. The optical film includes a plurality of low refraction protrusions disposed on a surface of a flexible display, wherein each of the low refraction protrusions is formed having an isosceles trapezoid shape; and a high refraction layer disposed covering the low refraction protrusions.

In some embodiments, a refractive index of the low refraction protrusions may be less than a refractive index of the high refraction layer.

In some embodiments, the optical film may further include a plurality of nanobeads disposed in the low refraction protrusions.

In some embodiments, a refractive index of the nanobeads is between the refractive index of the low refraction protrusions and the refractive index of the high refraction layer.

In some embodiments, the flexible display may be configured to emit green light having a first wavelength, and the high refraction layer may be configured to absorb green light having a second wavelength.

In some embodiments, the second wavelength may range from about 460 nm to about 480 nm.

In some embodiments, the optical film may further include a retarder plate disposed on the high refraction layer, and a polarizing plate disposed on the retarder plate.

DETAILED DESCRIPTION

In the following description, different embodiments of the inventive concept are described with reference to the drawings. As those skilled in the art would realize, the described embodiments may be modified in various ways without departing from the spirit or scope of the present disclosure. The drawings and description are merely illustrative in nature and should not be construed as limiting the inventive concept. Like reference numerals denote like elements throughout the specification.

In the drawings, the thickness of layers, films, panels, regions, etc., may be exaggerated for clarity. It will be understood that when an element such as a layer, film, region, or substrate is referred to as being disposed "on" another element, it can be disposed directly on the other element or with one or more intervening elements being present.

In addition, unless indicated to the contrary, the word "comprise" and variations such as "comprises" or "comprising" will be understood to imply the inclusion of stated elements but not the exclusion of any other elements. Further, in the specification, an upper part of a target portion may refer to an upper part or a lower part of the target portion depending on an orientation of the target portion.

First, an organic light emitting diode (OLED) display according to an exemplary embodiment of the inventive concept will be described with reference to FIGS. 1 to 3.

Figure 1A:
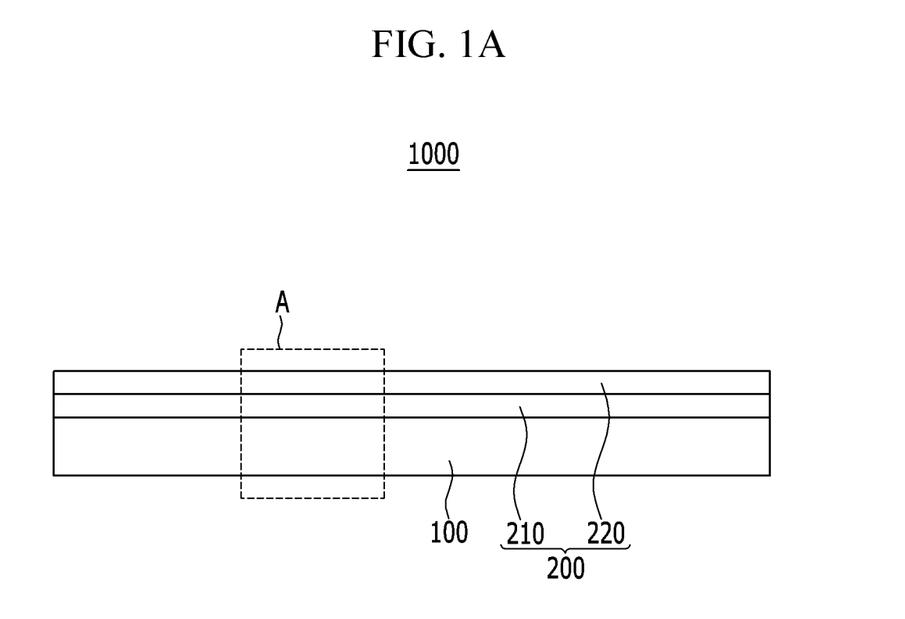
FIG. 1(A), FIG. 1(B) and FIG. 1(C) show cross-sectional views of an organic light emitting diode (OLED) display according to an embodiment of the inventive concept.
Figure 1B:
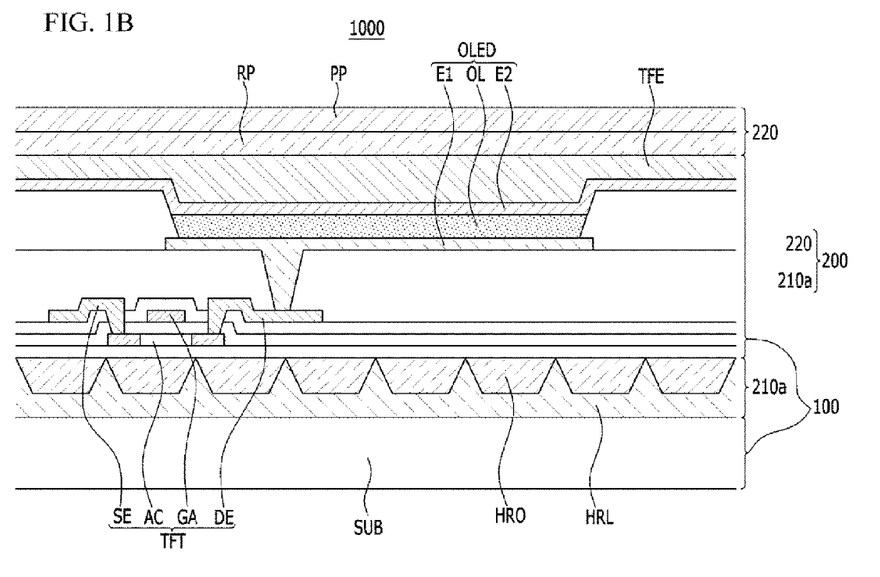
Figure 1C:
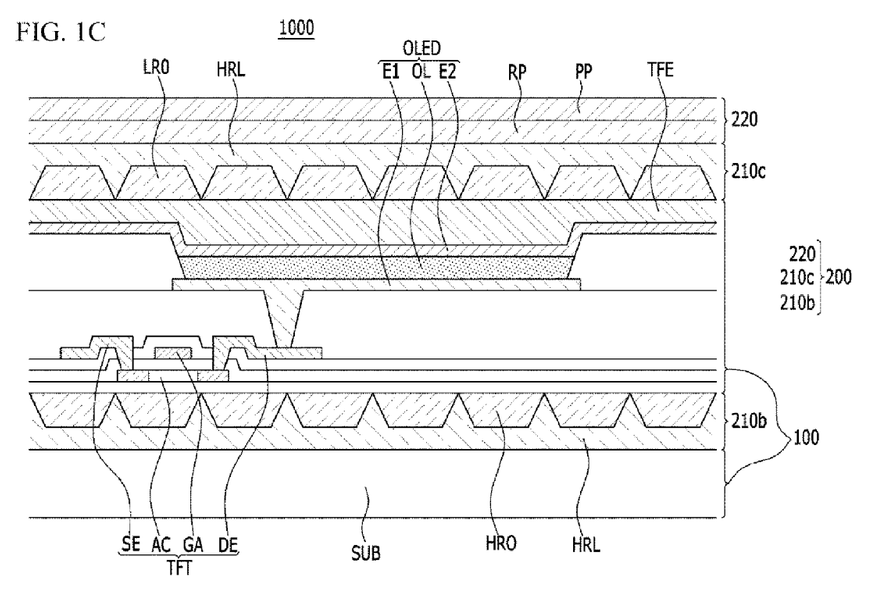

FIG. 1(A), FIG. 1(B) and FIG. 1(c) show cross-sectional views of an organic light emitting diode (OLED) display 1000 according to an embodiment.

As shown in FIG. 1(A), the organic light emitting diode (OLED) display 1000 includes a flexible display 100 and an optical film 200.

The flexible display 100 is configured to display an image. The flexible display 100 can be bent in various directions as desired by a user.

The optical film 200 is disposed on a top surface of the flexible display 100. The optical film 200 includes a first film 210 and a second film 220. The first film 210 improves image quality of the flexible display 100, and the second film 220 controls reflection of external light irradiated to the flexible display 100.

In the embodiment of FIG. 1(A), the optical film 200 is disposed on the top surface of the flexible display 100. Nevertheless, the inventive concept is not limited to the above-described configuration. In some embodiments, the optical film 200 may be disposed on a bottom surface of the flexible display 100. In some other embodiments, the optical film 200 may be disposed on both the top side and the bottom side of the flexible display 100.

The optical film 200 may be formed as a separate film and attached to the surface of the flexible display 100. In some embodiments, the optical film 200 may be formed on the surface of the flexible display 100 through a deposition process (such as chemical vapor deposition or sputtering).

Figure 2:
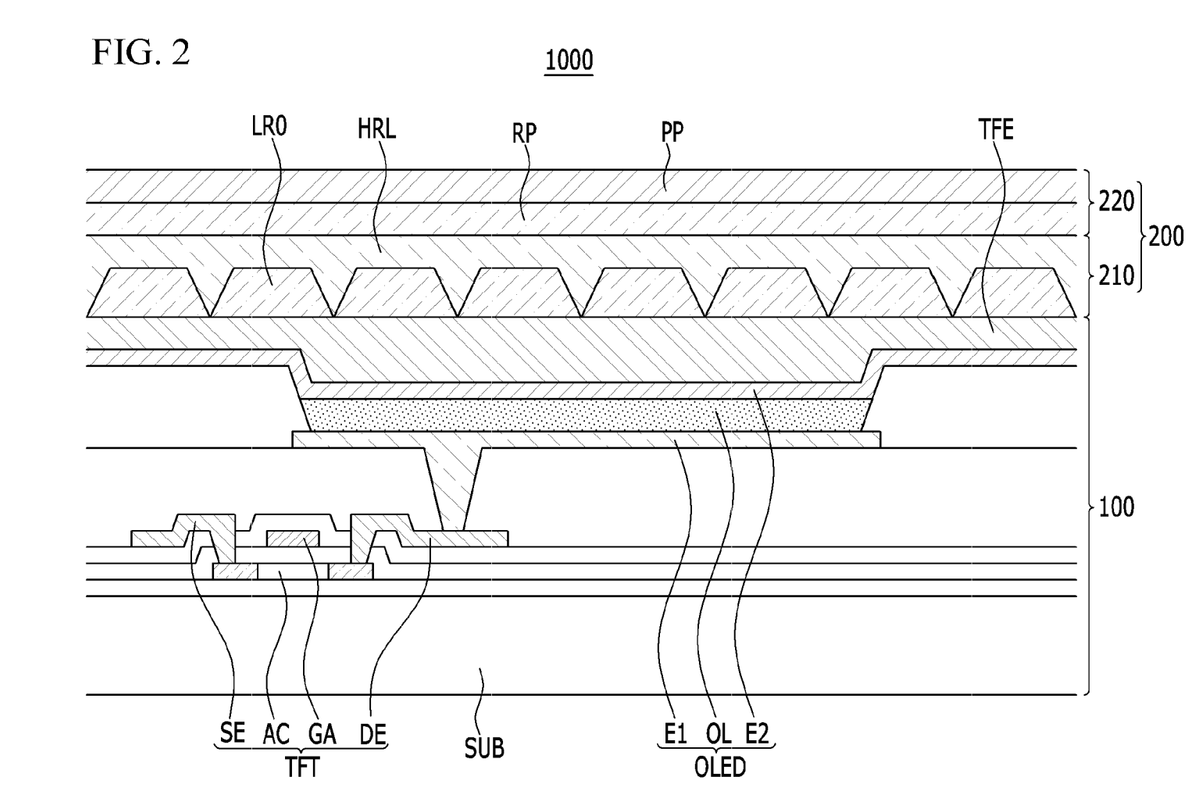
FIG. 2 shows a cross-sectional view of portion A of FIG. 1(A).

FIG. 2 shows a cross-sectional view of portion A of FIG. 1(A).

As shown in FIG. 2, the flexible display 100 includes a flexible substrate (SUB), a thin film transistor (TFT), an organic light emitting diode (OLED), and a thin film encapsulator (TFE).

The flexible substrate (SUB) is an insulating substrate including glass, polymer, or a metal. The flexible substrate (SUB) is flexible which allows the organic light emitting diode (OLED) display 1000 to bend in different directions.

The thin film transistor (TFT) is disposed on the flexible substrate (SUB). The thin film transistor (TFT) includes an active layer (AC), a source electrode (SE), a drain electrode (DE), and a gate electrode (GA). The thin film transistor (TFT) can be formed in various configurations as one of ordinary skill in the art would readily appreciate. In the interest of clarity, only one thin film transistor (TFT) is illustrated in FIG. 2, although it should be appreciated that the organic light emitting diode (OLED) display 1000 can include a plurality of thin film transistors (TFTs). In some embodiments, the organic light emitting diode (OLED) display 1000 may include at least one capacitor connected to the thin film transistor (TFT).

The organic light emitting diode (OLED) is disposed on the flexible substrate (SUB) and is connected to the thin film transistor (TFT). The organic light emitting diode (OLED) includes a first electrode (E1), a second electrode (E2), and an organic emission layer (OL).

The first electrode (E1) is connected to the thin film transistor (TFT). The first electrode (E1) may be formed as an optically reflective electrode or an optically semi-transmissible electrode. The first electrode (E1) can include a conductive material (such as silver (Ag), aluminum (Al), indium tin oxide (ITO), or indium zinc oxide (IZO)). The first electrode (E1) can also function as an anode of the organic light emitting diode (OLED).

The second electrode (E2) faces the first electrode (E1) with the organic emission layer (OL) disposed therebetween. The second electrode (E2) may be formed as an optically transmissible electrode or an optically semi-transmissible electrode. The second electrode (E2) can include a conductive material (such as silver (Ag), aluminum (Al), indium tin oxide (ITO), or indium zinc oxide (IZO)). The second electrode (E2) can also function as a cathode of the organic light emitting diode (OLED).

In some embodiments, the first electrode (E1) can be formed as an optically transmissible electrode functioning as a cathode, and the second electrode (E2) can be formed as an optically reflective electrode functioning as an anode.

The organic emission layer (OL) is disposed between (and in contact with) the first electrode (E1) and the second electrode (E2). The organic emission layer (OL) has a predetermined thickness between the first electrode (E1) and the second electrode (E2). As a result, the first electrode (E1) and the second electrode (E2) have a predetermined distance therebetween (corresponding to the predetermined thickness of the organic emission layer (OL)). The predetermined distance can be a distance that is configured to achieve a microcavity effect on the light emitted by the organic emission layer (OL).

The organic emission layer (OL) may emit red, blue, green, and/or white light. The light emitted by the organic emission layer (OL) is reflected multiple times between the first electrode (E1) and the second electrode (E2) according to the predetermined distance between the first electrode (E1) and the second electrode (E2), such that constructive interference of the light emitted by the organic emission layer (OL) generates light of a predetermined wavelength. Accordingly, the light emitted by the organic emission layer (OL) undergoes microcavity effect, and is transmitted through the second electrode (E2) (at a predetermined wavelength) to the outside of the organic light emitting diode (OLED) display 1000.

For example, when the organic emission layer (OL) emits white light, the white light is reflected multiple times between the first electrode (E1) and the second electrode (E2). Subsequently, the white light undergoes microcavity effect that converts it to the wavelength of green light. Therefore, the white light emitted by the organic emission layer (OL) undergoes microcavity effect, and is transmitted through the second electrode (E2) to the outside of the organic light emitting diode (OLED) display 1000 as green light. Accordingly, a viewer will observe green light being emitted by the organic light emitting diode (OLED) display 1000.

The thin film encapsulator (TFE) is disposed on the organic light emitting diode (OLED), and encapsulates both the organic light emitting diode (OLED) and the flexible substrate (SUB). The thin film encapsulator (TFE) can be formed by alternately stacking at least one organic layer and at least one inorganic layer. The organic layer includes polymers, and may be formed as a single layer or a multi-layer structure including at least one of polyethylene terephthalate, a polyimide, a polycarbonate, an epoxy, polyethylene, and a polyacrylate. In some embodiments, the organic layer can be formed of a polyacrylate, and may include a polymerized monomer composition including di-acrylate monomer and tri-acrylate monomer. In some embodiments, a mono-acrylate monomer can be included in the polymerized monomer composition. In some embodiments, a photoinitiator (such as TPO) can be further included in the monomer composition. The inorganic layer can be formed as a single layer or a multi-layer structure including a metal oxide or a metal nitride. For example, the inorganic layer can include at least one of SiNx, $Al_2O_3$, $SiO_2$, and $TiO_2$.

The optical film 200 is disposed on the thin film encapsulator (TFE).

In some embodiments, the optical film 200 may be disposed on the surface of the thin film encapsulator (TFE). In some other embodiments, the optical film 200 may be disposed on the surface of the flexible substrate (SUB).

The first film 210 of the optical film 200 includes a low refraction protrusion (LRO) and a high refraction layer (HRL).

The low refraction protrusion (LRO) is disposed on the surface of the thin film encapsulator (TFE) and has an isosceles trapezoid shape. As shown in FIG. 2, a plurality of low refraction protrusions (LRO) may be disposed on the surface of the thin film encapsulator (TFE) adjacent to each other. A refractive index of the low refraction protrusion (LRO) may be less than a refractive index of the high refraction layer (HRL), and may range from about 1.4 to about 1.6. For example, in some embodiments, the refractive index of the low refraction protrusion (LRO) is about 1.4. The low refraction protrusion (LRO) can include at least one of a silicon nitride (SiNx), a silicon oxide (SiOx), and alumina ($Al_2O_3$).

In some other embodiments, the low refraction protrusion (LRO) can be disposed on the surface of the flexible substrate (SUB). In those embodiments, the light emitted by the organic light emitting diode (OLED) may be visible from a side of the flexible substrate (SUB).

The high refraction layer (HRL) is disposed covering the plurality of low refraction protrusions (LRO) on the surface of the thin film encapsulator (TFE). The refractive index of the high refraction layer (HRL) may be greater than the refractive index of the low refraction protrusion (LRO), and may range from about 1.4 to about 1.6. For example, in some embodiments, the refractive index of the high refraction layer (HRL) is about 1.6. The high refraction layer (HRL) can include at least one of a silicon nitride (SiNx), a silicon oxide (SiOx), and alumina ($Al_2O_3$).

In some other embodiments, the high refraction layer (HRL) can be disposed on the surface of the flexible substrate (SUB). In those embodiments, the light emitted by the organic light emitting diode (OLED) may be visible from a side of the flexible substrate (SUB).

The second film 220 of the optical film 200 includes a retarder plate (RP) and a polarizing plate (PP).

The retarder plate (RP) is a ¼ wavelength plate, and is disposed on the high refraction layer (HRL). The retarder plate (RP) has an optical axis having a predetermined angle with respect to a polarization axis of the polarizing plate (PP). The retarder plate (RP) can circularly polarize linearly polarized light and linearly polarize circularly polarized light.

The polarizing plate (PP) has a predetermined polarization axis and linearly polarizes light in a polarization axis direction. Specifically, the polarizing plate (PP) allows light corresponding to the predetermined polarization axis to pass through, and absorbs light that does not correspond to the predetermined polarization axis. Accordingly, only linearly polarized light is transmitted through the polarizing plate (PP).

The second film 220 controls reflection caused by external light and transmits the light emitted by the organic light emitting diode (OLED). For example, when external light passes through the polarizing plate (PP), the external light is linearly polarized to the predetermined optical axis. The linearly polarized light passes through the retarder plate (RP) and is circularly polarized to the left or the right. If the light is circularly polarized to the left, the light will be circularly polarized to the right after being reflected by the organic light emitting diode (OLED). If the light is circularly polarized to the right, the light will be circularly polarized to the left after being reflected by the organic light emitting diode (OLED). After the circularly polarized light is reflected by the organic light emitting diode (OLED), the circularly polarized light passes through the retarder plate (RP) and is linearly polarized to another optical axis that is different from the predetermined optical axis, such that the circularly polarized light is absorbed by the polarizing plate (PP). Accordingly, after the external light passing through the polarizing plate (PP) is reflected by the organic light emitting diode (OLED), the reflected light will no longer be visible on the outside of the organic light emitting diode (OLED) display 1000 because it is absorbed by the polarizing plate (PP). Thus, the second film 220 can be configured to control reflection caused by the external light.

Next, the effects of bending the organic light emitting diode (OLED) display 1000 of FIG. 2 will be described with reference to FIG. 3.

Figure 3:
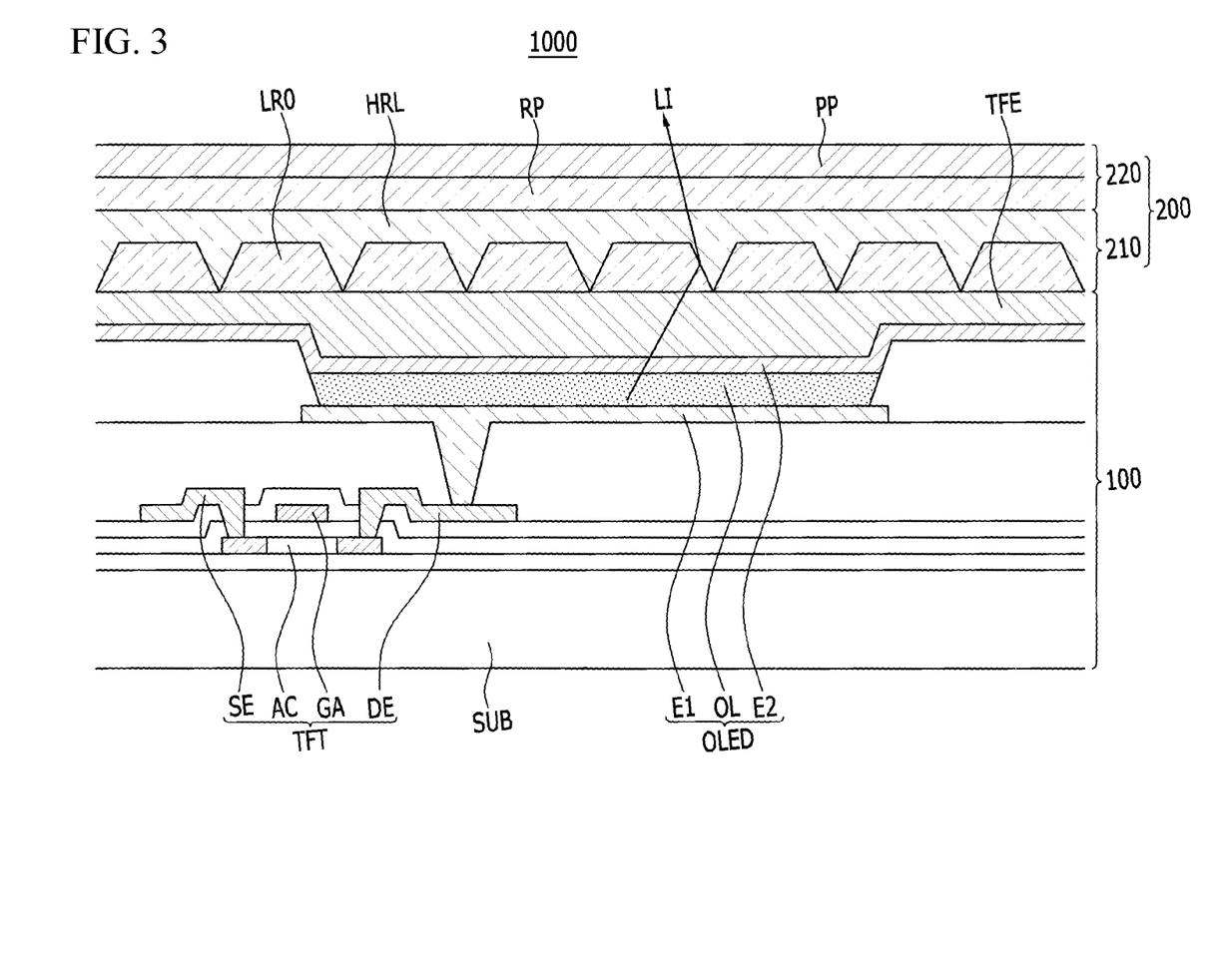
FIG. 3 shows a cross-sectional view of the organic light emitting diode (OLED) display of FIG. 2 in a bent position.

FIG. 3 shows a cross-sectional view of the bent organic light emitting diode (OLED) display of FIG. 2 in a bent position.

As previously described, the first film 210 of the optical film 200 includes the low refraction protrusion (LRO) and the high refraction layer (HRL) covering the low refraction protrusion (LRO). As shown in FIG. 3, when the flexible substrate (SUB) is bent, the organic light emitting diode (OLED) is tilted by the degree that the flexible substrate (SUB) is being bent. Specifically, the organic light emitting diode (OLED) is tilted with a predetermined angle according to the curvature of the bent flexible substrate (SUB). Subsequently, the light (LI) emitted by the organic light emitting diode (OLED) is refracted at the interface of the low refraction protrusion (LRO) and the high refraction layer (HRL), and irradiated to the front of the organic light emitting diode (OLED) display 1000 (in the direction of the arrow shown in FIG. 3) instead of being irradiated in the tilted direction. Accordingly, the luminance of the image displayed at the front of the organic light emitting diode (OLED) display 1000 (in a bent position), as observed by a viewer, can be improved using the above-described embodiments, thereby leading to improved image quality.

Next, an organic light emitting diode (OLED) display according to another exemplary embodiment of the inventive concept will be described with reference to FIGS. 4 and 5.

Figure 4:
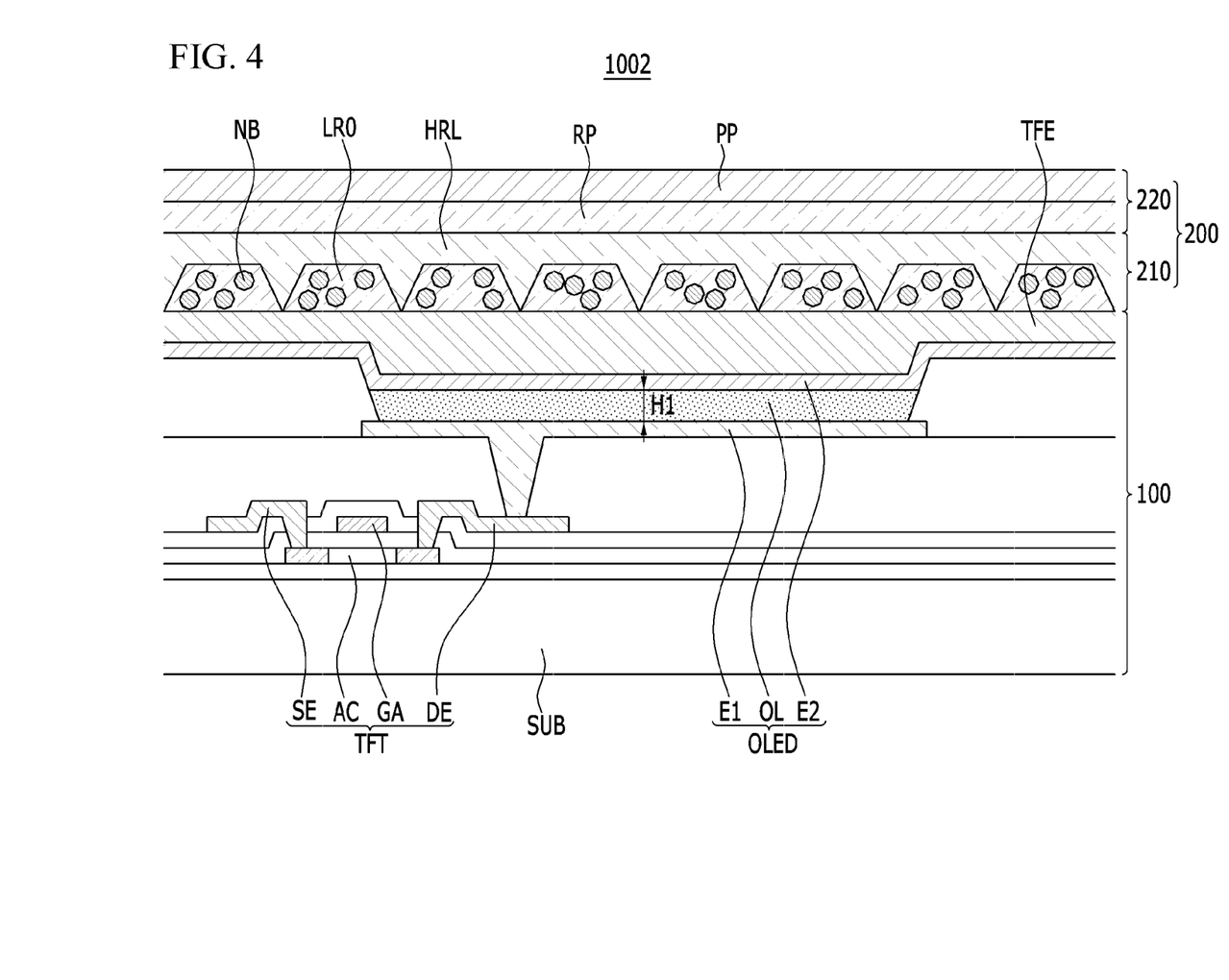
FIG. 4 shows a cross-sectional view of an organic light emitting diode (OLED) display according to another embodiment of the inventive concept.
Figure 5:
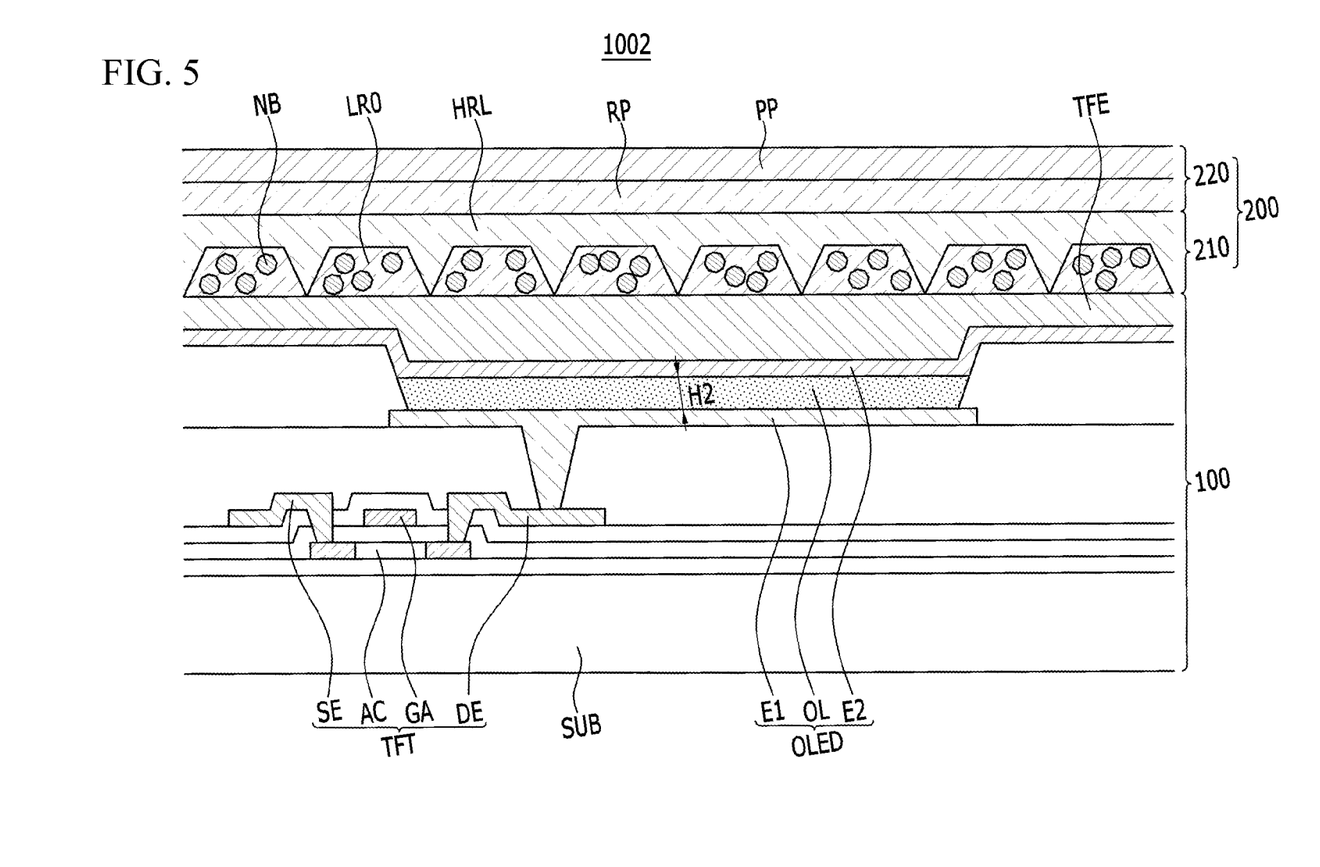
FIG. 5 shows a cross-sectional view of the organic light emitting diode (OLED) display of FIG. 4 in a bent position.

The embodiment of FIGS. 4 and 5 is similar to the embodiment of FIGS. 2 and 3, and therefore a detailed description of the similar elements shall be omitted. In the interest of clarity, the description shall focus on the differences between the embodiments.

FIG. 4 shows a cross-sectional view of an organic light emitting diode (OLED) display 1002 according to another embodiment.

As shown in FIG. 4, the organic light emitting diode (OLED) display 1002 includes an optical film 200. The optical film 200 includes a first film 210. The first film 210 includes a low refraction protrusion (LRO), a high refraction layer (HRL), and a plurality of nanobeads (NB).

Referring to FIG. 4, the nanobeads (NB) are disposed in a plurality of low refraction protrusions (LRO). The refractive index of the nanobeads (NB) may lie between the refractive index of the low refraction protrusion (LRO) and the refractive index of the high refraction layer (HRL), and may range from about 1.4 to about 1.6. For example, in some embodiments, the nanobeads (NB) have a refractive index of about 1.45 to about 1.5. The nanobeads (NB) can be formed in polygonal shapes such as a triangle, a quadrangle, a pentagon, a hexagon, a heptagon, or an octagon. In some embodiments, the nanobeads (NB) may be formed having various shapes such as a circular shape or a closed loop shape. The nanobeads (NB) may be formed having nanometer-scale dimensions. The nanobeads (NB) can include a silicon oxide, a silicon nitride, and/or a metal. For example, in some embodiments, the nanobeads (NB) can include silica ($SiO_2$).

FIG. 5 shows a cross-sectional view of the organic light emitting diode (OLED) display of FIG. 4 in a bent position.

Referring to FIG. 4, a distance between the first electrode (E1) and the second electrode (E2) of the organic light emitting diode (OLED) is given by a first distance (H1). As shown in FIG. 5, when the flexible substrate (SUB) is bent, the organic light emitting diode (OLED) display 1002 is tilted by a predetermined angle according to the curvature of the bent flexible substrate (SUB). Specifically, when the organic light emitting diode (OLED) display 1002 is tilted by the predetermined angle, the distance between the first electrode (E1) and the second electrode (E2) changes from the first distance (H1) (FIG. 4) to a second distance (H2) (FIG. 5). As a result of the change in the distance between the first electrode (E1) and the second electrode (E2), the light emitted by the organic light emitting diode (OLED) changes from a predetermined wavelength to another wavelength before passing through the second electrode (E2).

After the light emitted by the tilted organic light emitting diode (OLED) with the changed wavelength passes through the second electrode (E2), the light is then scattered by the nanobeads (NB), such that the light is visible at the front of the organic light emitting diode (OLED) display 1002.

The scattered light is refracted at the interface of the low refraction protrusion (LRO) and the high refraction layer (HRL), and irradiated to the front of the organic light emitting diode (OLED) display 1002 instead of being irradiated in different scattered directions. Accordingly, the luminance of the image displayed at the front of the organic light emitting diode (OLED) display 1002 (in a bent position), as observed by a viewer, can be improved using the above-described embodiments, thereby leading to improved image quality.

Next, an organic light emitting diode (OLED) display according to a further exemplary embodiment of the inventive concept will be described with reference to FIG. 6.

Figure 6:
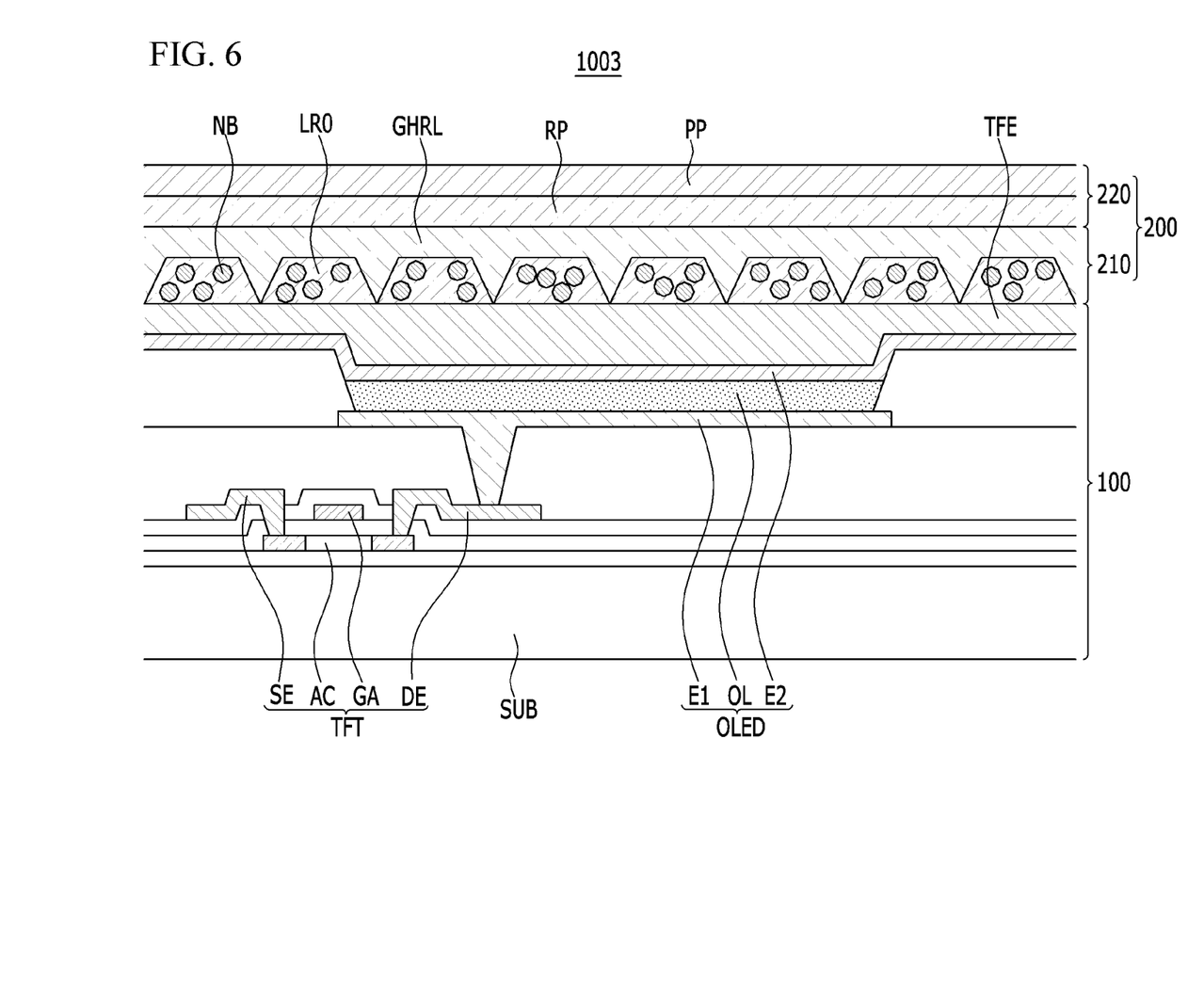
FIG. 6 shows a cross-sectional view of an organic light emitting diode (OLED) display according to a further embodiment of the inventive concept.

The embodiment of FIG. 6 is similar to the embodiment of FIGS. 4 and 5, and therefore a detailed description of the similar elements shall be omitted. In the interest of clarity, the description shall focus on the differences between the embodiments.

FIG. 6 shows a cross-sectional view of an organic light emitting diode (OLED) 1003 display according to a further embodiment.

As shown in FIG. 6, the organic light emitting diode (OLED) display 1003 includes an optical film 200. The optical film 200 includes a first film 210. The first film 210 includes a low refraction protrusion (LRO), a high refraction layer (GHRL), and a plurality of nanobeads (NB).

The organic light emitting diode (OLED) display 1003 includes an organic light emitting diode (OLED) emitting green light having a first wavelength. The high refraction layer (GHRL) may absorb green light having a second wavelength that is different from the first wavelength. In some embodiments, the second wavelength may range from about 460 nm to about 480 nm.

In the embodiment of FIGS. 4 and 5, external light passing through the retarder plate (RP) can include light having the second wavelength (of about 460 nm to about 480 nm). The external light is circularly polarized after passing through the retarder plate (RP). The circularly polarized light is then scattered by the nanobeads (NB), reflected by the organic light emitting diode (OLED), and transmitted through the polarizing plate (PP), such that the light is visible on the outside of the organic light emitting diode (OLED) display 1002. Accordingly, when the organic light emitting diode (OLED) does not emit light, the external light can still be reflected by the organic light emitting diode (OLED) such that green light having the wavelength ranging from about 460 nm to about 480 nm will be visible on the outside of the organic light emitting diode (OLED) display 1002.

The embodiment of FIG. 6 can address the above issue relating to the (undesired) display of external green light. As previously mentioned, the organic light emitting diode (OLED) display 1003 of FIG. 6 includes the high refraction layer (GHRL) for absorbing green light having the second wavelength ranging from about 460 nm to about 480 nm. In the example of FIG. 6, green light having the first wavelength emitted by the organic light emitting diode (OLED) transmits through the high refraction layer (GHRL) and is visible on the outside of the organic light emitting diode (OLED) display 1003. However, external green light having the second wavelength (of about 460 nm to about 480 nm) reflected by the organic light emitting diode (OLED) will be absorbed by the high refraction layer (GHRL). Accordingly, the high refraction layer (GHRL) serves to control the external green light being reflected by the organic light emitting diode (OLED), such that the external green light is not visible on the outside of the organic light emitting diode (OLED) display 1003. In particular, the external green light is not visible on the outside of the organic light emitting diode (OLED) display 1003 even when the organic light emitting diode (OLED) is not emitting light.

Similar to the embodiment in FIGS. 4 and 5, the scattered light in the embodiment of FIG. 6 is refracted at the interface of the low refraction protrusion (LRO) and the high refraction layer (HRL), and irradiated to the front of the organic light emitting diode (OLED) display 1003 instead of being irradiated in different scattered directions. Accordingly, the luminance of the image displayed at the front of the organic light emitting diode (OLED) display 1003 (in a bent position), as observed by a viewer, can be improved using the above-described embodiments, thereby leading to improved image quality.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements within the spirit and scope of the present disclosure.

What is claimed is:

1. An organic light emitting diode display comprising;
a flexible substrate;
an organic light emitting diode disposed on the flexible substrate;
a thin film encapsulator disposed on the organic light emitting diode;
a plurality of low refraction protrusions disposed on at least one of a surface of the flexible substrate and the thin film encapsulator, wherein each of the plurality of low refraction protrusions is formed having an isosceles trapezoid shape; and
a high refraction layer disposed covering the plurality of low refraction protrusions.

2. The organic light emitting diode display of claim 1, wherein
a refractive index of the low refraction protrusions is less than a refractive index of the high refraction layer.

3. The organic light emitting diode display of claim 2, wherein
the refractive index of the low refraction protrusions is about 1.4, and the refractive index of the high refraction layer is about 1.6.

4. The organic light emitting diode display of claim 2, further including:
a plurality of nanobeads disposed in the low refraction protrusions.

5. The organic light emitting diode display of claim 4, wherein
the refractive index of the nanobeads is between the refractive index of the low refraction protrusions and the refractive index of the high refraction layer.

6. The organic light emitting diode display of claim 5, wherein
the refractive index of the nanobeads ranges from about 1.4 to about 1.6.

7. The organic light emitting diode display of claim 4, wherein
the organic light emitting diode is configured to emit green light having a first wavelength, and
the high refraction layer is configured to absorb green light having a second wavelength.

8. The organic light emitting diode display of claim 7, wherein
the second wavelength ranges from about 460 nm to about 480 nm.

9. The organic light emitting diode display of claim 7, further including:
a retarder plate disposed on the high refraction layer, and
a polarizing plate disposed on the retarder plate.

* * * * *